United States Patent
Aletras (10) Patent No.: US 7,835,783 B1
(45) Date of Patent: Nov. 16, 2010

(54) MAGNETIC RESONANCE IMAGING METHODS AND APPARATUS FOR TIME-SERIES MOTION TRACKING WITH INVERSION RECOVERY COMPENSATION

(75) Inventor: Anthony H. Aletras, Rockville, MD (US)

(73) Assignee: The United States of America as represented by the Department of Health and Human Services, Washington, DC (US)

( * ) Notice: Subject to any disclaimer, the term of this patent is extended or adjusted under 35 U.S.C. 154(b) by 1089 days.

(21) Appl. No.: 10/421,535

(22) Filed: Apr. 21, 2003

Related U.S. Application Data (60) Provisional application No. 60/374,914, filed on Apr. 22, 2002.

(51) Int. Cl.
*A61B 5/05* (2006.01)
(52) U.S. Cl. .................. 600/413; 600/407; 600/410; 324/307; 324/309
(58) Field of Classification Search .................. 600/407, 600/410, 413; 324/307, 309
See application file for complete search history.

(56) References Cited

U.S. PATENT DOCUMENTS

| | | | |
|---|---|---|---|
| 5,054,489 A | 10/1991 | Axel et al. | |
| 5,111,820 A | 5/1992 | Axel et al. | |

(Continued)

FOREIGN PATENT DOCUMENTS

EP  0184840  5/1989

(Continued)

OTHER PUBLICATIONS

Aletras et al., "Mixed Echo Train Acquisition Displacement Encoding with Stimulated Echoes: An Optimized Dense Method for In Vivo Functional Imaging of the Human Heart," Magn. Res. Med. 46:523-534 (2001).

(Continued)

*Primary Examiner*—Brian Casler
*Assistant Examiner*—Joel M Lamprecht
(74) *Attorney, Agent, or Firm*—Klarquist Sparkman, LLP (57) ABSTRACT

Image contributions produced by an untagged specimen magnetization component in magnetic resonance imaging are controlled by applying one or more radiofrequency (RF) pulses that invert at least a portion of the untagged specimen magnetization. In an example, a specimen is tagged with a spatially modulated magnetization that is used to produce an image signal that includes a contribution associated with the tagged magnetization and an untagged magnetization. The untagged magnetization is substantially along an axial direction defined by an applied axial magnetic field. The untagged magnetization increases in magnitude because of so-called $T_1$ relaxation. A contribution to the image signal increases for a predetermined time or to a predetermined magnitude, and a 180-degree pulse is applied to invert at least a portion of the untagged magnetization. The untagged magnetization is then antiparallel with respect to the applied axial magnetic field. Additional inversion recovery causes the untagged magnetization to increase from a negative value to zero and then becomes positive. As a result, signal contributions associated with the untagged magnetization are reduced. Additional 180-degree pulses can be applied whenever the untagged magnetization becomes larger than a predetermined value so that image contrast can be maintained. When the tagged magnetization decreases to a predetermined level, an initial specimen magnetization is reestablished for subsequent imaging.

13 Claims, 7 Drawing Sheets

U.S. PATENT DOCUMENTS

| | | | |
|---|---|---|---|
| 5,217,016 A * | 6/1993 | Axel et al. | 600/410 |
| 5,417,214 A * | 5/1995 | Roberts et al. | 600/413 |
| 6,546,274 B2 * | 4/2003 | Itagaki et al. | 600/413 |
| 6,721,589 B1 * | 4/2004 | Zhu et al. | 600/413 |
| 6,892,089 B1 * | 5/2005 | Prince et al. | 600/410 |
| 2001/0031037 A1 * | 10/2001 | Prince et al. | 378/137 |

FOREIGN PATENT DOCUMENTS

| | | |
|---|---|---|
| EP | 0401908 | 5/1996 |
| WO | WO 98/56294 | 12/1998 |
| WO | WO 00/09010 | 2/2000 |
| WO | WO 00/64344 | 11/2000 |
| WO | WO 01/11380 | 2/2001 |
| WO | WO 01/58353 | 8/2001 |

OTHER PUBLICATIONS

Fischer et al., "Improved Myocardial Tagging Contrast," Magn. Res. Med. 30:191-200 (1993).

Frangi et al., "Three-Dimensional Modeling for Functional Analysis of Cardiac Images: A Review," IEEE Trans. Med. Imaging 20:2-25 (2001).

Heiland, "Bewegungsverfolgung des schlagenden Herzens an hyperfein-getaggten, schichtverfolgenden CSPAMM Aufnahmen," accessed on the Internet Mar. 13, 2002 at mbi.dkfz-heidelberg.de/mbi/sfb414/mot_ana.html.

Kuijer et al., "Improved Harmonic Phase Myocardial Strain Maps," Magn. Res. Med. 46:993-999 (published online Oct. 18, 2001).

Osman et al., "Cardiac Motion Tracking Using CINE Harmonic Phase (HARP) Magnetic Resonance Imaging," Magn. Res. Med. 42:1048-1060 (1999).

Stuber et al., "Single Breath-Hold Slice-Following CSPAMM Myocardial Tagging," MAGMA 9:85-91 (1999).

* cited by examiner

MAGNETIC RESONANCE IMAGING METHODS AND APPARATUS FOR TIME-SERIES MOTION TRACKING WITH INVERSION RECOVERY COMPENSATION

RELATED APPLICATION

This application claims the benefit of U.S. Provisional Application No. 60/374,914, filed Apr. 22, 2002, which is incorporated herein by reference.

TECHNICAL FIELD

The invention pertains to methods and apparatus for magnetic resonance imaging.

BACKGROUND

Many imaging techniques have been applied to cardiac imaging in order to aid in the diagnosis and treatment of cardiac disease. Such imaging techniques include angiocardiography, isotope imaging, two-dimensional ultrasound, cardiac computed tomography, and magnetic resonance imaging (MRI). Of these techniques, MRI offers numerous advantages. For example, MRI permits high soft-tissue discrimination between blood and myocardium without the need for a contrast medium and can provide functional as well as anatomical information.

Functional cardiac imaging is especially important in the evaluation and treatment of cardiac disease and MRI methods that permit evaluation of cardiac motion are particularly useful. Axel et al., U.S. Pat. No. 5,111,820, describes an MRI method based on spatial modulation of magnetization (SPAMM) in which two sets of orthogonal tagging planes are used to image two-dimensional heart wall motion. Translation, distortion, or other change in appearance of the tagging planes permits assessment of cardiac movement. Unfortunately, the tagged magnetization used to establish the tagging planes begins to decay upon completion of the tagging process so that image signals gradually deteriorate. In addition, any decreases in the magnitude of the tagged magnetization contribute to an untagged magnetization that includes no specimen motion information and represents an increase in image background, reducing tag image contrast.

Image contrast in SPAMM images can be improved using the so-called "complementary" SPAMM (C-SPAMM) method. In this method, a component of magnetization with tagging information is separated from a component of magnetization without tagging information by performing measurements with a positive tagging grid and a negative tagging grid. A difference between the measurement results using the positive and negative tagging grids is obtained. Because positive and negative tagging grids produce magnetizations of opposite signs, image signal portions associated with the two tagged magnetizations are effectively summed. Image signal portions associated with the untagged magnetization do not depend on the sign of the tagging grid and are eliminated or substantially reduced by the difference operation. Such methods are described in, for example, Fischer et al., "Improved Myocardial Tagging Contrast," Mag. Res. Med. 30:191-200 (1993).

While C-SPAMM does permit improved image contrast, the need for measurements with two tagging grids increases imaging time. In cardiac imaging, a patient must typically hold her breath during measurement, and C-SPAMM requires a doubling of breath-hold time. Many cardiac patients find the necessary SPAMM breath-hold period uncomfortably long and are unable to satisfy the longer C-SPAMM breath-hold time. While more than one breath-hold can be used, any patient movement or different breath depth degrades the quality of cardiac images that are intended to display cardiac motion alone. In addition, untagged magnetization suppression in C-SPAMM MRI is less effective when multiple breath-holds are used. Accordingly, improved MRI methods are needed.

SUMMARY OF THE INVENTION

Magnetic resonance imaging apparatus include a magnet configured to apply an axial magnetic field to a specimen and produce a specimen magnetization having an axial component. A magnetic field gradient controller is situated to process the axial component of magnetization and produce a specimen magnetization that includes at least a spatially encoded axial component. A radiofrequency (RF) pulse source is situated to apply at least one RF pulse selected to invert at least a portion of an unencoded axial component of specimen magnetization. A detection system produces at least a first image signal and a second image signal, wherein the first image signal includes contributions from the encoded component and the unencoded component of specimen magnetization, and the second image signal includes contributions from the encoded component and the inverted unencoded component of specimen magnetization.

According to some examples, the RF pulse source is configured to apply the at least one RF pulse at a time based on a magnetization relaxation time constant of the specimen. In further embodiments, the RF pulse source is configured to produce at least one RF pulse so that image signal contributions from the unencoded magnetization in the first and second signals are less than a predetermined value.

Magnetic resonance imaging systems include a specimen encoder configured to produce a spatially modulated axial magnetization in at least a portion of the specimen. An image acquisition system produces an image signal based on the spatially modulated axial magnetization and an unmodulated axial component of magnetization. A controller compensates image signal contributions associated with relaxation of the unmodulated component of magnetization. According to a representative example, the controller is configured to apply at least one radiofrequency pulse that inverts at least a portion of the unmodulated axial component of magnetization. In a particular example, the controller is configured to apply at least one 180 degree radiofrequency pulse to invert the unmodulated component of magnetization.

Image compensation systems for magnetic resonance imaging of a specimen include an RF pulse generator and a radiofrequency coil in communication with the RF pulse generator. A controller applies at least one RF pulse at a predetermined time, wherein the at least one RF pulse is configured to invert at least a portion of a spatially unmodulated axial magnetization. According to additional embodiments, the inverted spatially unmodulated axial magnetization is associated with relaxation of a spatially unmodulated axial magnetization.

Magnetic resonance imaging methods include detecting an initial specimen magnetization and producing a first electrical signal associated with at least a portion of a first image of a specimen based on the detected initial specimen magnetization. A contrast compensation radio frequency (RF) pulse is applied to at least a portion of the specimen to produce a compensated specimen magnetization and the compensated specimen magnetization is detected. A second electrical signal is produced that is associated with at least a portion of a second specimen image based on the detected compensated specimen magnetization. According to representative embodiments, the contrast compensation RF pulse is configured to invert at least a portion of an axial component of the initial specimen magnetization. In a particular example, the contrast compensation RF pulse is a π-pulse. In additional examples, the first and second electrical signals include signal portions associated with a spatially modulated specimen magnetization and a spatially unmodulated specimen magnetization.

Magnetic resonance imaging methods include obtaining an electrical signal associated with at least a portion of a specimen image based on a specimen magnetization and applying a radiofrequency pulse configured to at least partially invert at least one component of a specimen magnetization. An electrical signal associated with at least a portion of a specimen image based on a specimen magnetization is obtained and an electrical signal based on an axial magnetization in a specimen is produced, wherein the electrical signal includes a contribution from an encoded component of an axial magnetization and an unencoded component of the axial magnetization. A radio frequency pulse is applied to substantially invert the axial magnetization and the inverted axial magnetization is detected to produce a specimen image.

Methods of controlling inversion recovery signal contributions in magnetic resonance imaging include applying a radiofrequency pulse configured to at least partially invert an axial component of specimen magnetization. An image signal is produced that includes a contribution from the inverted axial component of specimen magnetization. In some examples, the radiofrequency pulse is applied based on a predetermined magnitude of a contribution of an unencoded magnetization to the image signal.

Methods of cardiac imaging include establishing at least an axial magnetization in at least a portion of a heart and producing a spatially encoded magnetization based on the axial magnetization. An image signal is obtained that is associated with at least a portion of the heart based on the spatially encoded magnetization. At least one compensation pulse is applied to control an image signal portion associated with an unencoded magnetization. According to representative examples, production of the spatially encoded magnetization is initiated at a time associated with a portion of a cardiac cycle. In a particular example, production of the spatially encoded magnetization is initiated a time associated with a systolic cycle. In other examples, the compensation pulse is a 180 degree pulse selected to invert an unencoded magnetization. In additional examples, a series of compensation pulses are applied at predetermined times.

Methods of controlling an image signal associated with relaxation of a magnetization include inverting the magnetization and allowing the magnitude of the inverted magnetization to decrease. An image signal associated with the decreased magnetization is obtained.

A magnetic resonance imaging method includes repetitively applying a compensation pulse to a specimen, wherein the compensation pulse is configured to invert at least an untagged axial magnetization component of a specimen and is applied at a rate selected to control the magnitude of the untagged axial magnetization. An image of at least a portion of a specimen is obtained based on an image signal that include contributions from a tagged axial magnetization component and the untagged axial magnetization component of a specimen. According to representative examples, the image signal is based on a spatially varying amplitude or a spatially varying phase of the tagged component of the specimen magnetization.

These and other features are described below with reference to the accompanying drawings.

BRIEF DESCRIPTION OF THE DRAWINGS

FIGS. 3A-3D illustrate specimen magnetizations produced during spatial tagging with a one dimensionally varying tagging magnetic field using the method of FIG. 2A.

FIGS. 5A-5C illustrate time evolution of a tagged magnetization produced using 45 degree pulses.

FIGS. 9A-9B are magnetic resonance images of a specimen encoded with a one-dimensionally varying tagging magnetic field. FIG. 9A was obtained directly after encoding. The image of FIG. 9B was obtained after a delay of 375 ms but with application of contrast compensation pulses.

DETAILED DESCRIPTION

Figure 1:
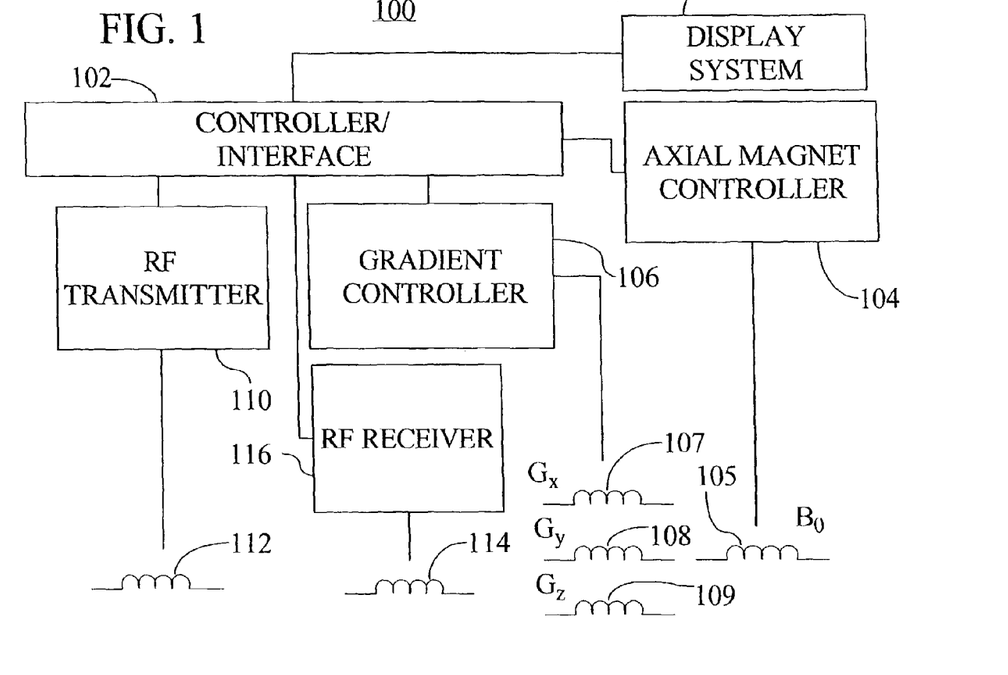
FIG. 1 is a schematic block diagram of a magnetic resonance imaging (MRI) system.

FIG. 1 is a schematic block diagram of a magnetic resonance imaging (MRI) system 100 that functions in response to a controller 102 that is typically programmed by a clinician with a series of commands corresponding to a particular imaging sequence. The command sequences can be entered with a keyboard, a pointing device such as a mouse, or other input device. Command sequences can be stored by the controller 102 for retrieval from a hard disk, floppy disk, or other computer readable media. Command sequences can be arranged as a menu, so that a clinician can select among an imaging protocol from various command sequences.

The MRI system 100 includes an axial magnet controller 104 that activates an axial field coil 105 to produce an axial magnetic field $B_0$. This activation is typically performed when the MRI system 100 is initialized, and thereafter the axial magnetic field is maintained. As used herein, the axial magnetic field $B_0$ is directed along a +z-axis in an xyz-coordinate system. A plane parallel to an xy-plane (perpendicular to the z-axis) is referred to as a transverse plane. A gradient controller 106 activates gradient coils 107, 108, 109 that produce magnetic field gradients $G_x$, $G_y$, $G_z$ along the x-, y-, and z-axes, respectively.

An RF transmitter 110 is configured to generate RF pulses that are applied to a transmitter coil 112 to produce magnetic field pulses. A receiver coil 114 detects sample magnetizations and communicates the detected sample magnetizations to an RF receiver 116. The RF receiver 116 processes detected sample magnetizations and provides an associated electrical signal to the controller 102 and a display system 120.

A patient or specimen to be imaged is exposed to the axial field $B_0$ and a field gradient along a particular direction, for example, $G_x$, is selected by the controller 102. An RF pulse is applied to produce a change in magnetization that is detected by the receiver coil 114 and processed by the RF receiver 116. The RF pulse is typically represented as product of a pulse envelope $B_1$ and a complex exponential $\exp(j\omega_{RF}t)$, wherein t is time, j is the square root of $-1$, and $\omega_{RF}$ is an excitation carrier frequency. The excitation frequency $\omega_{RF}$ is generally selected to be approximately equal to a resonance frequency of one or more constituents of the patient or other specimen. The resonance frequency is proportional to a product of a gyromagnetic ratio $\gamma$ (a material constant) and a magnitude of the axial field $B_0$. By applying a field gradient with the gradient coils 107-109 so that the specimen or patient is exposed to a non-uniform magnetic field, slices of the patient are selected for image formation. Detecting magnetization slice by slice permits image formation. Other details of image formation can be found in, for example, Liang et al., *Principles of Magnetic Resonance Imaging: A Signal Processing Perspective*, IEEE Press, Piscataway, N.J. (2000).

With only the axial magnetic field $B_0$ applied, at least some magnetic dipoles of sample constituents align with the axial magnetic field $B_0$ to produce a local magnetization that generally has only a +z-directed component $M_z$. Individual magnetic dipoles of dipole moment $\mu$ precess about the direction of $B_0$ (the z-axis) at frequency $\omega_{Larmor}=\gamma \mu B_0$, referred to as the Larmor frequency, wherein $\gamma$ is a gyromagnetic ratio, and $\mu$ is a magnetic dipole moment. Magnetizations are described herein with reference to an xyz (Cartesian) coordinate system that rotates about the axial direction at the Larmor frequency. The z-axis of such a rotating coordinate system is the same as the z-axis of a stationary coordinate system while the x-axis and y-axis of the rotating coordinate system rotate in a transverse plane with respect to the stationary coordinate system. If the axial magnetic field $B_0$ is constant and the sample magnetization has been perturbed from the z-axis, then the sample magnetization relaxes towards an initial axial magnetization with time constant $T_1$. This relaxation of sample magnetization is referred to as spin-lattice relaxation, longitudinal relaxation, or $T_1$ relaxation.

Application of a selected RF pulse can rotate a sample magnetization or one or more components thereof. An RF pulse of duration and magnitude sufficient to produce a 180 degree rotation is referred to as a 180 degree pulse (or a $\pi$-pulse); and an RF pulse sufficient to produce a 90 degree rotation is referred to as a 90 degree pulse (or a $\pi/2$-pulse). In general, an RF pulse sufficient to produce a rotation $\alpha$ is referred to as an $\alpha$-pulse. The axis of rotation of these pulses can be selected based on the direction in which the corresponding pulse magnetic field is applied. For convenience, pulse sequences are described below with reference to particular axes, but other axes can be used.

Figure 2A:
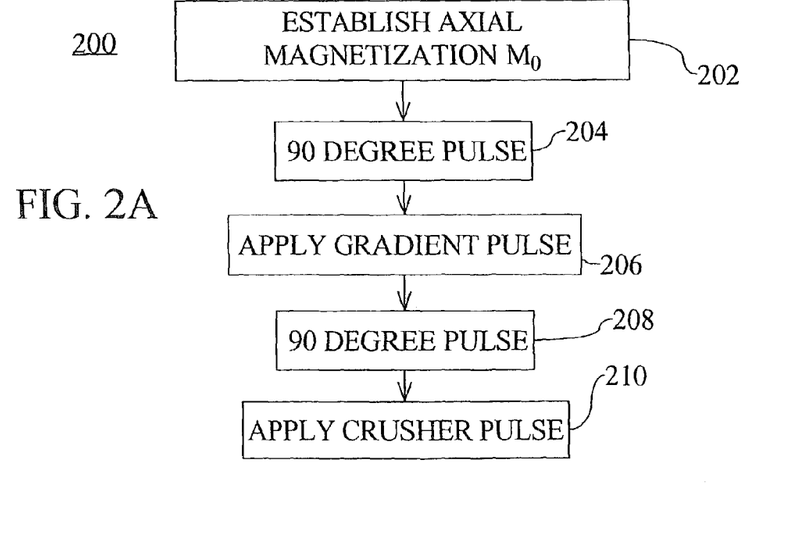
FIG. 2A is a schematic block diagram of a representative method of establishing a tagged specimen magnetization using 90 degree radiofrequency (RF) pulses.

With reference to FIG. 2A, a method 200 of generating a spatially encoded ("tagged") specimen magnetization for MRI includes establishing the specimen in an axial magnetic field $B_0$ in a step 202 to produce an initial specimen magnetization $M_0$ that is directed along the z-axis and parallel to $B_0$. The initial specimen magnetization $M_0$ is typically substantially uniform throughout a specimen imaging region, but in general, the initial magnetization $M_0$ can be a function of position, i.e., $M_0=M_0(x,y,z)$. In a step 204, the RF transmitter produces a $\pi/2$-pulse about the x-axis so that the initial magnetization $M_0$ is rotated onto the xy-plane to produce a y-directed magnetization of magnitude $M_0$. Rotation about the x-axis is selected for convenience, and other axes of rotation can be used, or rotations about two or more axes can be provided. A gradient magnetic field pulse or other spatially varying magnetic field pulse is applied along the y-axis in a step 206 to produce a spatially modulated magnetization. In a y-directed gradient magnetic field, a spin precession frequency is $\gamma B_0+\gamma G_y y$, so that in a coordinate system rotating at the Larmor frequency $\gamma B_0$, the magnetization acquires a y-dependent phase shift $\phi=\gamma G_y y\tau$, wherein $\tau$ is a gradient pulse duration. The x-component of magnetization is then proportional to $M_0 \sin(\gamma G_y y\tau)$ and the y-component of magnetization is proportional to $M_0 \cos(\gamma G_y y\tau)$, ignoring any constant phase factors. Thus, the application of the gradient magnetic field pulse produces a spatially phase-modulated or tagged magnetization $M(y)$. A $\pi/2$-pulse is applied about the y-axis in a step 208 so that x-components of the encoded magnetization are rotated to be parallel to the z-axis. In a step 210 a crusher pulse or spoiler pulse is applied to reduce signal effects produced by y-components of magnetization that are not rotated by the $\pi/2$-pulse applied in the step 210. Alternatively, the y-components can be allowed to decay by so-called $T_2^*$ decay or otherwise eliminated or reduced.

Figure 3A:
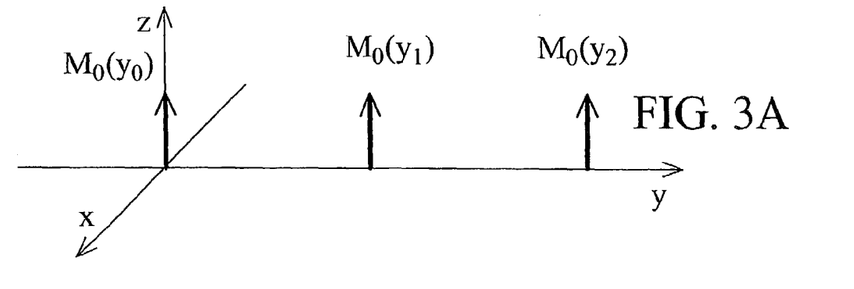
FIG. 3A illustrates an untagged axial magnetization.
Figure 3B:
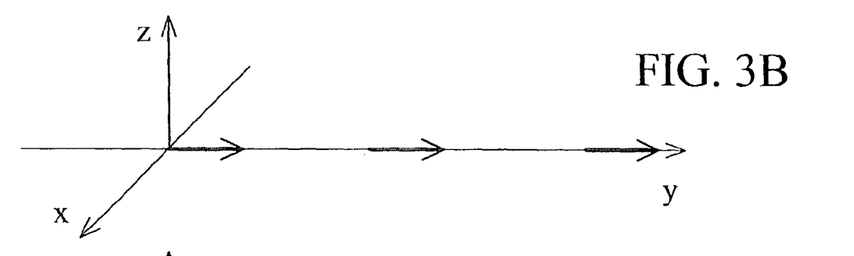
FIG. 3B illustrates rotation of the untagged axial magnetization into a transverse plane using a π/2-pulse.
Figure 3C:
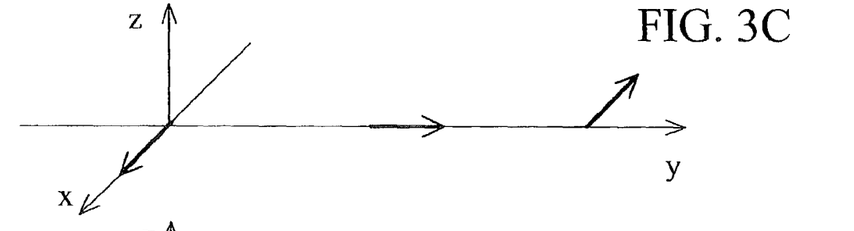
FIG. 3C illustrates spatially tagging the transverse magnetization with a gradient magnetic field.
Figure 3D:
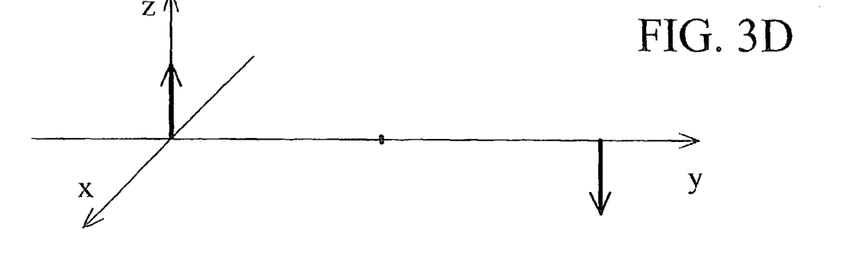
FIG. 3D illustrates the spatially tagged, axial magnetization $M_Z(y)$ produced by application of a π/2-pulse to the magnetization of FIG. 3C and crushing or spoiling of other transverse components of magnetization.

The encoding process of FIG. 2A is further illustrated in FIGS. 3A-3D that show a magnetization $M(y)$ at representative spatial locations (x,y) for x=0 and y=$y_0$, $y_1$, and $y_2$ during spatial tagging. Referring to FIG. 3A, an initial z-directed magnetization of magnitude $M_0$ is produced that is substantially constant. Application of a $\pi/2$-pulse in the step 204 rotates the magnetization onto the transverse plane. As shown in FIG. 3B, the $\pi/2$-pulse is applied along the x-axis to produce a substantially uniform y-directed magnetization of magnitude $M_0$. Application of a y-directed gradient pulse of magnitude $G_y$ and duration $\tau$ in the step 206 produces a phase shift $\phi=\gamma G_y y\tau$. For purposes of illustration, $\gamma G_y y_0\tau$ is selected so that the transverse magnetization is directed in a +x-direction at $y_0$, a +y-direction at $y_1$, and a $-$x-direction at $y_2$, respectively as shown in FIG. 3C. Application of a $\pi/2$-pulse in the step 208 rotates the x-components of magnetization to produce corresponding z-directed magnetization components as illustrated in FIG. 3D. The y-component of magnetization is crushed in the step 210 and does not contribute to image signals and is not shown in FIGS. 3A-3D.

Figure 3E:
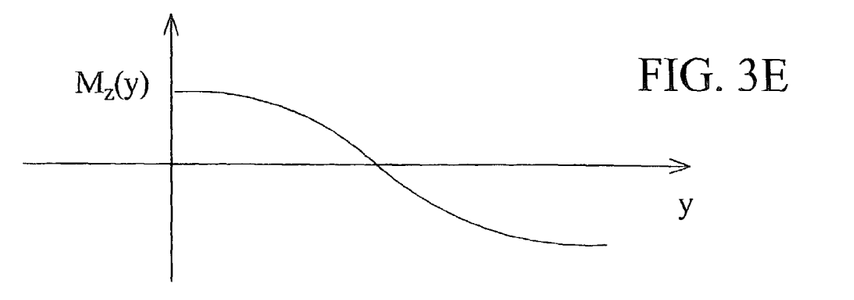
FIG. 3E is a graph of the tagged axial magnetization $M_Z(y)$ as a function of y-coordinate.

FIG. 3E illustrates a spatially encoded magnetization $M_Z(y)$ that is produced as shown in FIGS. 3A-3D by the encoding method of FIG. 2A. The spatially encoded magnetization $M_Z(y)$ has zero amplitude at $y=y_1$ and maximum positive and negative amplitudes at $y=y_0$ and $y=y_2$, respectively. Other spatial encodings are possible. For example, magnetization can be encoded to be spatially varying in x-, y-, and z-directions, or any combination of directions, and a phase shift φ can be a linear or other function of one or more spatial coordinates. The spatial encoding illustrated in FIGS. 3A-3E corresponds to an encoded magnetization $M_Z(y)$ that varies as a trigonometric function of the y-coordinate, but an encoded magnetization can be based on other functions of one or more coordinates. For convenience, tagging in a single direction is illustrated but generally two or more sets of orthogonal tagging planes are used.

Figure 2B:
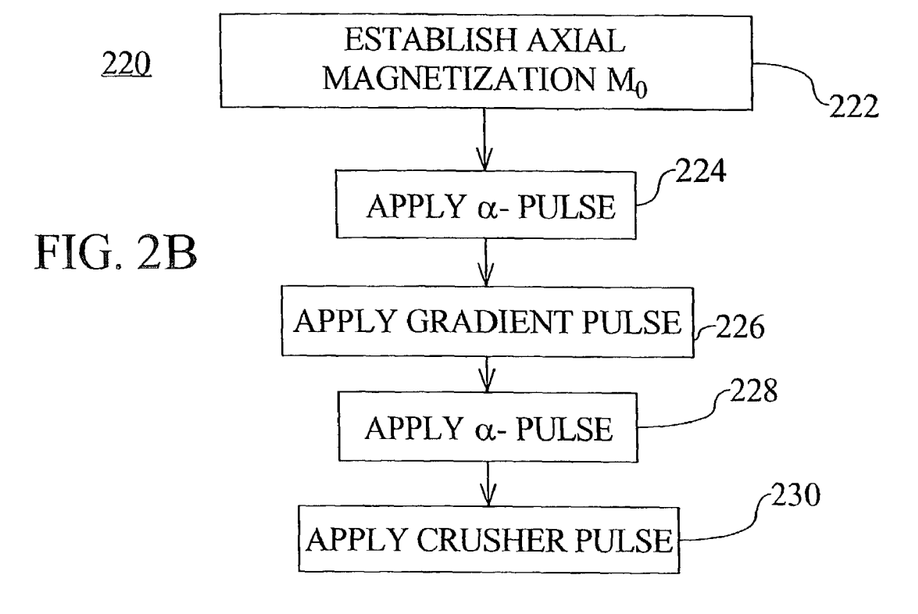
FIG. 2B is a schematic block diagram of a representative method of establishing a tagged magnetization using RF pulses of magnitude α.

Most MRI systems produce images associated with a magnitude but not with a sign of magnetization. If a spatially encoded magnetization is produced with pulses having flip angles greater than π/4, then the encoded magnetization is bipolar. Images based on such encoded magnetizations have intensity minima at image points at which the longitudinal magnetization is zero and image maxima at image points at which an absolute value of magnetization is at a maximum. Thus, a bipolar magnetization modulation produces twice as many tagging fringes or stripes in resulting images as a unipolar magnetization modulation of the same gradient encoding strength 206. With increasing delay between the application of the tagging sequence and imaging, longitudinal relaxation will produce pairwise merging of fringes at a time when the minimum magnetization equals zero. Further delays produce additional fringe fading but no additional fringe movement or distortion for stationary specimens. The time needed for fringes to merge can be used to estimate the value of a local $T_1$ relaxation time. Such stripe merging can be avoided by using a method 220 illustrated in FIG. 2B in which α-pulses are used to produce a tagged magnetization. If RF pulses are selected to produce a flip angle α that is less than π/4, fringe merging is avoided.

Figure 4:
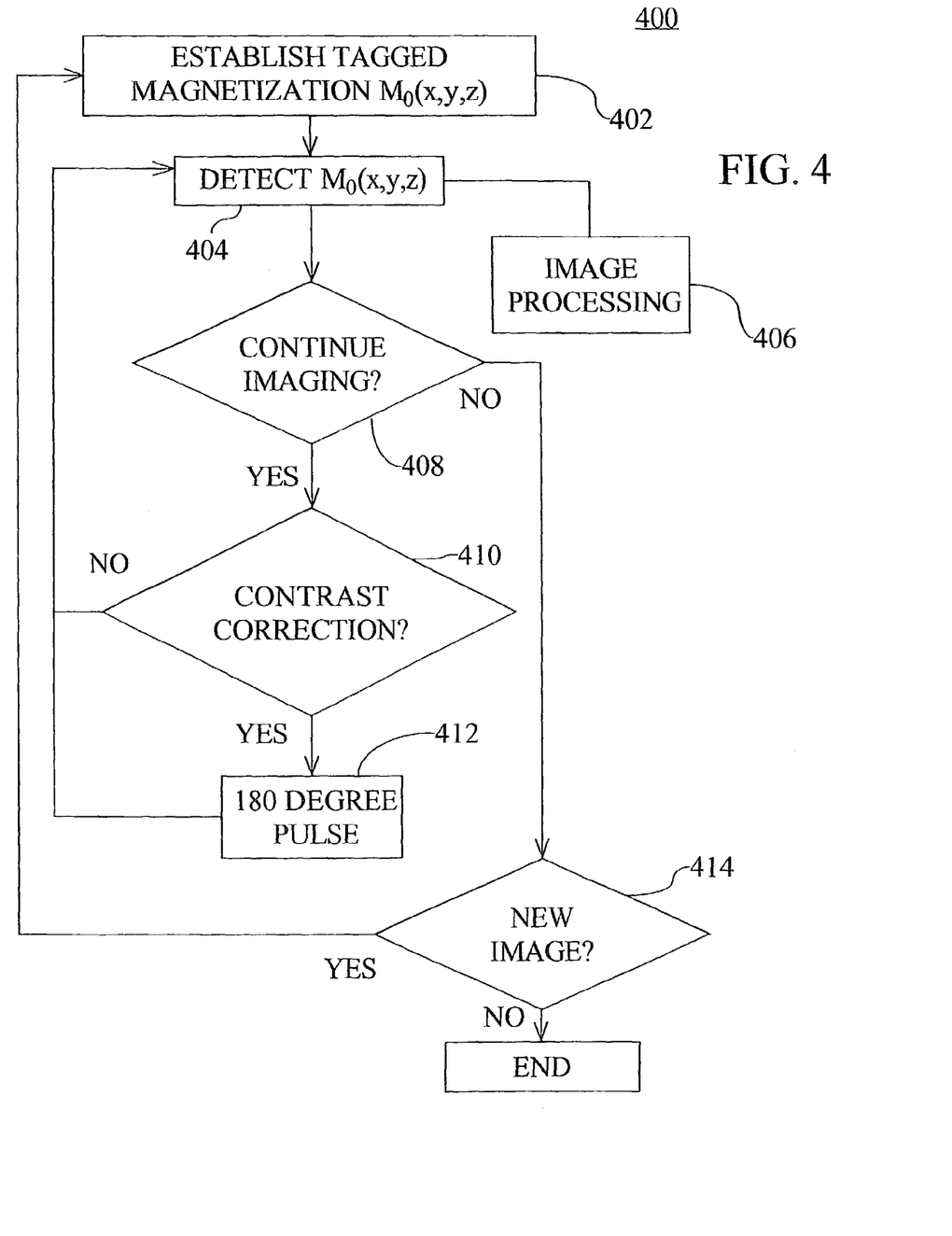
FIG. 4 is a schematic block diagram of a magnetic resonance imaging method in which a 180 degree pulse is applied to adjust image signal contributions associated with inversion recovery.
Figure 5A:
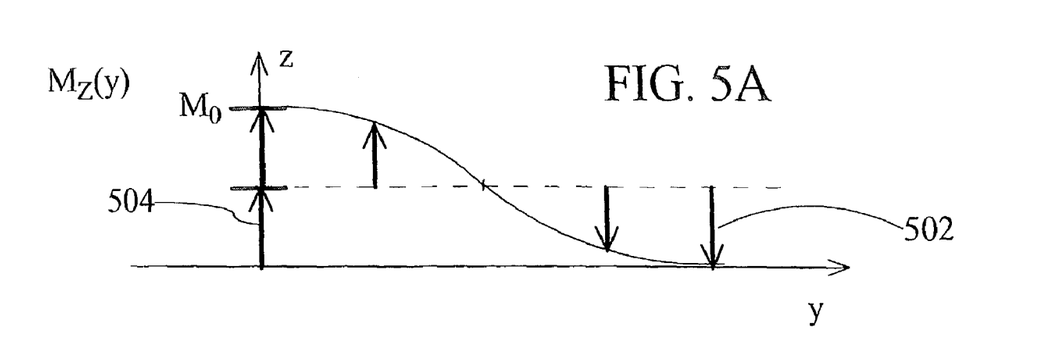
FIG. 5A illustrates a unipolar tagged magnetization that includes a modulated tagged component and an unmodulated untagged component.

FIG. 4 illustrates a representative method 400 of producing an image based on a spatially encoded magnetization. In a step 402, a spatially encoded magnetization is produced by a method such as that illustrated in FIG. 2B using π/4-pulses and an associated magnetization $M_Z(y)$ as illustrated in FIG. 5A. The magnetization $M_Z(y)$ includes an encoded portion 502 and an unencoded portion 504 having amplitudes $M_{ENC}$, $M_U$, respectively, wherein $M_Z(y)=M_{ENC}\cos(\phi)+M_U$. In the example of FIG. 5A, the amplitude $M_{ENC}$ of the encoded portion 502 is initially approximately equal to the amplitude $M_U$ of the unencoded portion 504, and $M_{ENC}=M_U=M_0/2$. The magnetization is detected in a step 404 and the detected magnetization is processed to form an image or a portion of an image in an image processing step 406.

Because $M_{ENC}=M_U=M_0/2$, the magnetization $M_Z(y)$ varies between a maximum value of $M_0$ and a minimum value of 0 so that the image includes tagging variations between zero and a maximum value. Because the magnetization is unipolar, fringe merging is not produced. After tagging has been completed (and during subsequent measurements), the amplitude $M_{ENC}$ of the encoded magnetization decreases and the amplitude $M_U$ of the unencoded magnetization increases due to so-called $T_1$ relaxation. Accordingly, at a time t after tagging, the magnetization $M_Z(y)$ is:

$$M_Z(y)=\cos(\phi)(M_0/2)\exp(-t/T_1)+(M_0/2)(1-\exp(-t/T_1)).$$

Thus, image contrast deteriorates due to decay of the tagged portion of the magnetization, and in a step 408 additional acquisitions of image signal are selected based on, for example, the magnitude of the remaining tagged magnetization or the arrival of an image trigger signal. In cardiac imaging, such a trigger can be obtained based on an electrocardiogram signal. If the tagged magnetization is no longer suitable for a predetermined image quality or if additional image signals are unwanted for other reasons, a control step 414 is executed to determine if a new imaging sequence based on reestablishment of specimen magnetization in the axial field $B_0$ is to be initiated. If not, the procedure ends. If the axial magnetization is to be reestablished, the step 402 is repeated.

If the tagged magnetization is sufficiently large as determined in the step 408, then a contrast correction step 410 is executed to determine if any decrease in image contrast caused by the increasing magnitude of the untagged magnetization is to be compensated. If no compensation is selected, the step 404 is repeated. Application of image contrast correction is determined in the step 410 based on, for example, a measured image contrast or on an elapsed time since tagging or an elapsed time since a previous contrast correction. If contrast correction is to be applied, a contrast compensation pulse such as π-pulse is applied in a step 412 so that the magnetization $M_Z$ changes sign. The encoded component continues to decay as before so that the encoded portion is proportional to $\cos(\phi)(M_0/2)\exp(-t/T_1)$. Because MRI typically depends on the magnitude of the magnetization and not the sign of the magnetization, image signal portions associated with the encoded magnetization are substantially unchanged by the π-pulse. After the it-pulse, the unencoded portion of the magnetization is directed along the −z direction and decays towards zero due to longitudinal ($T_1$) relaxation as a result of the inversion π-pulse, i.e. the unencoded magnetization exhibits inversion recovery. Thus, the magnitude of the unencoded magnetization decreases and begins to increase again only after passing through zero.

Figure 5B:
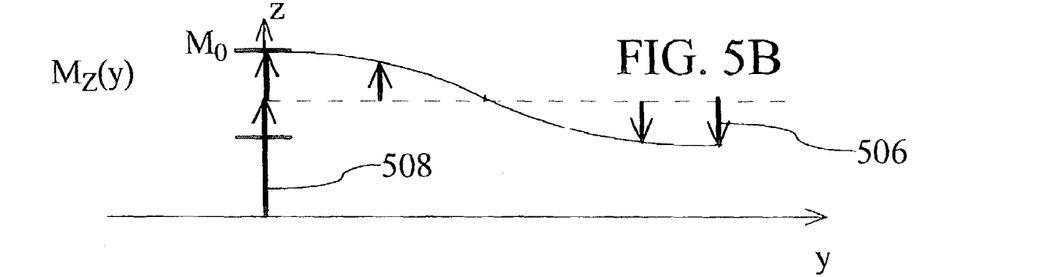
FIG. 5B illustrates the time evolution of the magnetization of FIG. 5A showing an increase in a magnitude of the untagged component, and a decrease in the magnitude of the modulated component.
Figure 5C:
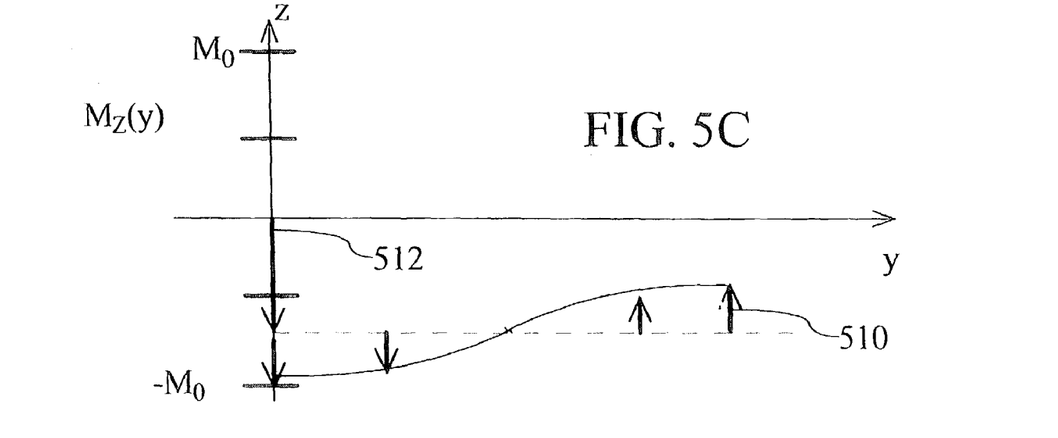
FIG. 5C illustrates the magnetization of FIG. 5B after application of a 180 degree pulse.

FIGS. 5B-5C illustrate the magnetization $M_Z(y)$ before and after application of the contrast compensation π-pulse in the step 412. Referring to FIG. 5B, the magnetization $M_Z(y)$ includes an encoded portion 506 and an unencoded portion 508, but the magnitudes of these portions have changed with respect to the initial magnitudes of FIG. 5A so that the minimum magnetization is no longer substantially zero, and the unencoded portion 508 is larger than the encoded portion. After application of a π-pulse, the magnetization is as shown in FIG. 5C. An unencoded portion 512 is larger than the encoded portion 510 but decreases in magnitude as the magnetization continues to gradually align with the applied axial magnetic field. This decrease in unencoded magnetization produces image signals with decreasing contributions from unencoded magnetization, and image contrast improves. Eventually, the z-component of the unencoded magnetization is zero and does not contribute to image signals. Subsequently, the unencoded portion increases to positive values (i.e., becomes +z directed) and image contrast degrades. An additional π-pulse can be applied to improve contrast again and this procedure can be repeated as the unencoded magnetization relaxes. Eventually, the tagged magnetization has experienced sufficient decay so that associated image signals produce unsatisfactory images. A tagging procedure is then re-initiated, typically after a delay of a few times the lifetime $T_1$ to allow spins to realign with the applied axial magnetic field. Because of the contrast compensation pulses (π-pulses in this example), the axial magnetization is generally small at the end of an imaging sequence and the specimen magnetization is re-established before beginning another imaging sequence.

Figure 6:
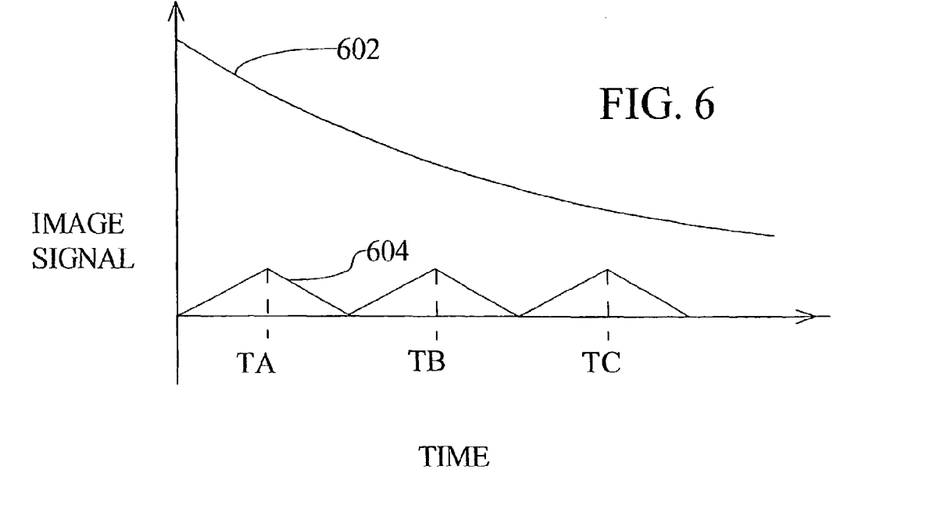
FIG. 6 includes graphs of magnitudes of image signal portions associated with tagged and untagged magnetizations as a function of time.

FIG. 6 is a graph illustrating magnitudes of image signal portions 602, 604 associated with the encoded and unencoded magnetizations, respectively. Contrast compensation pulses are applied at times TA, TB, TC. The signal portion 604 associated with the unencoded magnetization declines to zero after the compensation pulse and then begins to grow. The signal portion associated with the encoded magnetization 602 decays monotonically.

Figure 7:
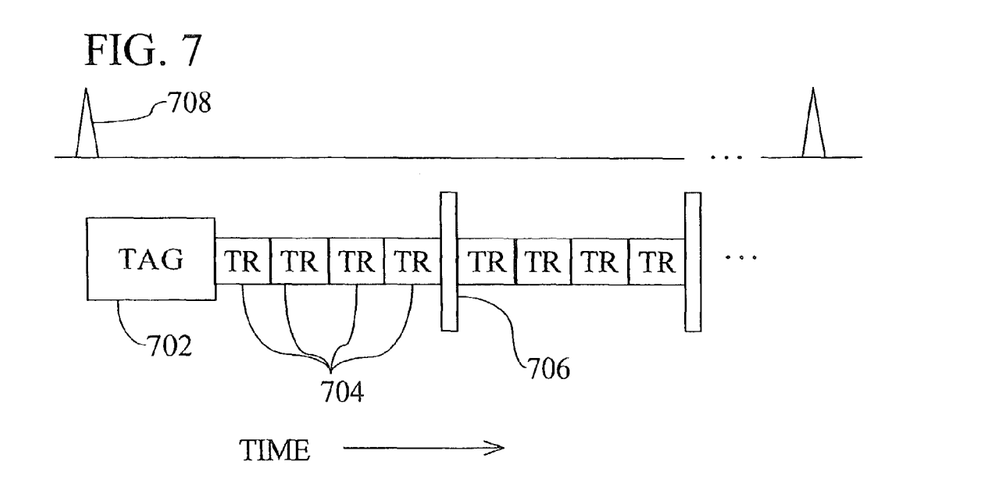
FIG. 7 illustrates a magnetic resonance imaging method that includes applying compensation pulses that control image contrast in images based on a spatially modulated specimen magnetization.

FIG. 7 illustrates a representative pulse sequence for imaging using contrast compensation pulses. A tagging pulse sequence 702 is applied followed by a series of signal acquisitions (TR) 704. A contrast compensating π-pulse 706 is applied and followed by additional signal acquisitions and π-pulses. For myocardial imaging, the pulse sequence is typically initiated based on a cardiac signal 708 obtained from, for example, an electrocardiogram.

Methods and apparatus are described with reference to compensation of SPAMM based MR images but such methods and apparatus can be used in other imaging methods such as fast displacement encoding with stimulated echoes (DENSE), harmonic phase tracking (HARP), and CINE HARP. Suppressing or attenuating unencoded MRI signal contributions using RF inversion pulses can be used to improve contrast in images based on multi-phase myocardial tagging and improve spatial resolution in multi-phase phase-contrast based imaging methods, where resolution is limited by tag-like artifacts generated by the interaction between unencoded and encoded signal contributions.

Image contrast in an MRI image based on an encoded specimen magnetization can be defined as a ratio $(I_{MAX} - I_{MIN})/I_{MIN}$, wherein $I_{MAX}$ is a maximum intensity in an image and $I_{MIN}$ is a minimum intensity in an image. Typically $I_{MAX}$ is associated with a bright fringe and $I_{MIN}$ is associated with a dark fringe.

Figure 8A:
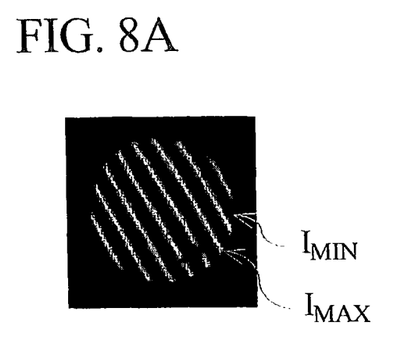
FIGS. 8A-8B are magnetic resonance images of a specimen encoded with a one-dimensionally varying tagging magnetic field obtained directly after coding and after a 375 ms delay, respectively, and without application of compensation pulses.
Figure 8B:
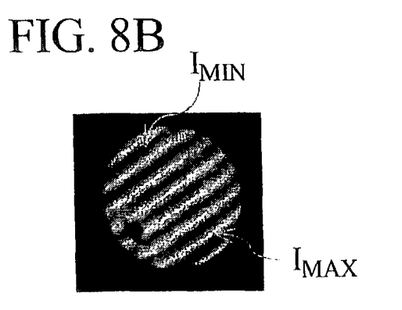
Figure 9A:
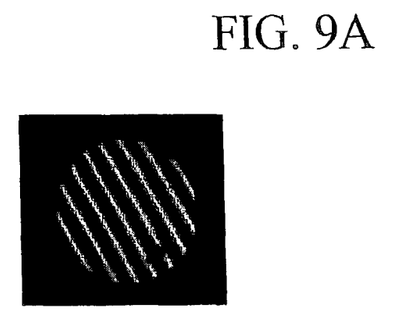
Figure 9B:
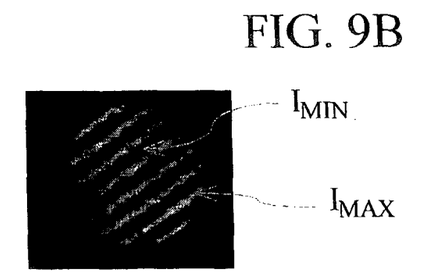

FIGS. 8A-8B are images of a rotating cylindrical specimen tagged with a one-dimensional tagging pattern obtained directly after tagging (FIG. 8A) and 375 ms after tagging (FIG. 8B). Image portions associated with minimum and maximum values are labeled $I_{MAX}$ and $I_{MIN}$, respectively. The loss of image contrast produced by increased signal contributions (increase in $I_{MIN}$) from an untagged component of magnetization produced by $T_1$ inversion recovery is apparent in FIG. 8B. FIGS. 9A-9B show similar images obtained using contrast compensation pulses. FIG. 9A is an image based on the one-dimensional tagging pattern and obtained directly after tagging. FIG. 9B is an image obtained 375 ms after tagging using a series of contrast compensation pulses. Contrast improvement is apparent as increases in $I_{MIN}$ are controlled by the contrast compensation pulses.

Specimen magnetization generally does not recover to an initial (pretagging) value because of the application of contrast control pulses such as π-pulses that inhibit increases in axial magnetization. In cardiac imaging, after the tagged magnetization has faded, a different specimen slice is imaged to allow magnetization in a previously imaged slice to relax to the initial magnetization. The specimen magnetization typically relaxes in a time of between about $T_1$ and $3T_1$, typically between about 270 ms and 850 ms. Use of a contrast agent that reduces $T_1$ can permit a slice to be reimaged sooner. In cardiac imaging applications, imaging of a systolic part of a cardiac cycle is typically especially important, and an image of the systolic cycle can be obtained and then specimen magnetization allowed to relax during the diastolic part of a cardiac cycle.

In examples described herein, 180 degree pulses (π-pulses) are used to change the sign (direction) of one or more magnetization components, typically the axial or z-component. Such a sign change can be referred to an inverting the magnetization component. In addition, pulse size is dependent on pulse duration and intensity, and pulse size can vary within about 20% or more of a designated value. Spatially varying magnetizations are referred to as encoded, tagged, or modulated, and imaging based on the spatial variation permits specimen movement to be imaged. While the axial field $B_0$ that is used to produce an initial magnetization can also vary, such variation is generally much less than the magnetization variation produced by tagging.

Inversion compensation can also be used in phase-based motion tracking MRI methods such as time-series DENSE and HARP image acquisition to provide, for example, increased spatial resolution. Displacement encoding in these methods is similar to that used in SPAMM as described above, but resulting displacement data is generally processed and presented differently. Rather than relying on a magnitude of the spatially modulated magnetization, as is done in SPAMM tagging, DENSE and HARP methods rely on interrogating magnetization phase to extract motion data. Since the encoding process results in, for example, a cosinusiodal or sinusoidal magnetization modulation, this encoded magnetization includes two phase components that can be expressed as complex conjugates of each other. For a modulation $\cos(\phi)$, the two phase components correspond to $e^{i\phi}/2$ and $e^{-i\phi}/2$. Phase-based methods typically acquire image signals based on only one of these two encoded phase components using decoding gradient pulses of the same area and either the same or opposite sign to that of the initial tag/position encoding gradient pulse.

Figure 10A:
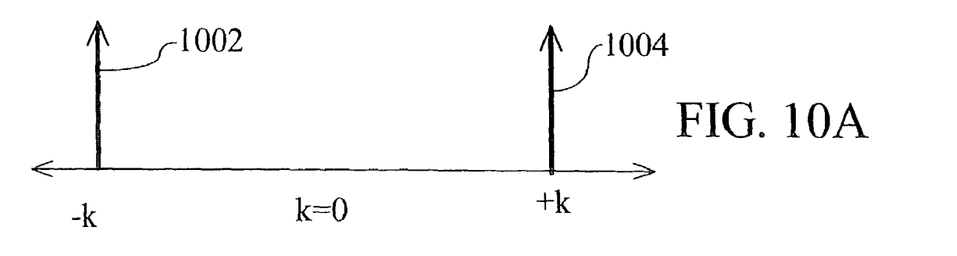
FIG. 10A is a schematic diagram illustrating relative magnitudes of k-space signal portions associated with an encoded magnetization.
Figure 10B:
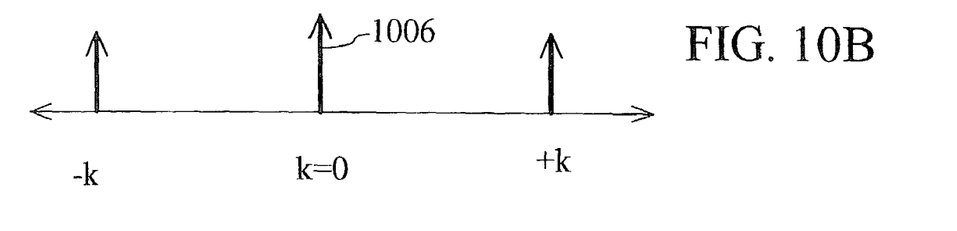
FIG. 10B is a schematic diagram illustrating relative magnitudes of k-space signal portions associated with an encoded magnetization and an unencoded magnetization.

In imaging methods based on a selected phase component, an unencoded magnetization produced by $T_1$-relaxation produces tag-like artifacts in images, especially at high spatial resolutions. Inversion compensation as described above can suppress the magnitude of the unencoded magnetization and reduce or eliminate such artifacts. With reference to FIGS. 10A-10B, relative magnitudes of k-space signal portions 1002, 1004 associated with an encoded magnetization associated with a positive phase shift $\phi$ and a negative phase shift $-\phi$ are shown schematically. The signal portions 1002, 1004 are shown at single k-space locations but generally include a range of spatial frequencies. Using the magnetization of FIG. 10A, an image signal can be based on one or more of the signal portions 1002, 1004. In MRI phase-based imaging methods such as DENSE, images are based on a spatially dependent phase of one of the signal portions and the amplitude modulation associated with fringes of SPAMM methods does not generally appear. A k-space filter is applied to reject one of the signal portions 1002, 1004 and phase or phase difference as a function of position in the selected signal portion is used to produce an image. To obtain high spatial resolutions, the k-space filter is selected to have a wide spatial frequency bandwidth so that high spatial frequency signal components contribute to images and so that the unselected signal portion does not introduce amplitude modulation or other image artifacts.

As shown in FIG. 10B, an image signal can also include an inversion relaxation (unencoded) signal portion 1006. This signal portion 1006 can introduce image artifacts and a k-space filter can be selected to reduce image contributions based on this signal portion. By periodically inverting an unencoded magnetization, the magnitude of the signal portion 1006 can be reduced or controlled. Because the sign of the encoded magnetization is altered after inversions associated with inversion suppression, image signal acquisition based on a single k-space filter acquires image data based on a complex conjugate of the encoded phase component that was sampled prior to an inversion pulse. This sign alternation can be compensated for by, for example, software post-processing conjugation of appropriate signal data portions or by modifying the acquisition process. For example, the sign of decoding gradient pulses can alternate in based on sign alternations associated with inversion suppression RF pulses. As in SPAMM imaging, application of compensation pulses reduces signal portions associated with unencoded magnetizations but does not reduce image signal contributions from either phase or amplitude based image signals associated with a tagged specimen magnetization.

While particular examples are described above, other examples can differ in arrangement and detail. For example, contrast compensation pulses can be applied periodically to a specimen until the magnitude of the encoded magnetization decreases to a predetermined level, or until a predetermined time based on, for example, a relaxation time constant $T_1$ or other time constant. Tagging and image compensation pulses of magnitudes other than $\pi/4$, $\pi/2$, and $\pi$ can be used and RF pulse and gradient fields can be applied along one or more axes. Additional gradient pulses can be applied to suppress unwanted stimulated and/or spin echoes associated with application of compensation pulses. SPAMM, DENSE, and HARP methods are described with reference to amplitude or phase modulation, but combinations of amplitude and phase modulation can be used for specimen imaging. The invention is directed to novel and non-obvious aspects of this disclosure, both individually and in combination as set forth in the claims below and I claim all that is encompassed by the appended claims.

I claim:

1. A magnetic resonance imaging method, comprising:
    establishing a tagged magnetization simultaneously throughout a specimen;
    repetitively applying a compensation pulse to the specimen, wherein the compensation pulse is configured to invert at least an untagged specimen axial magnetization component associated with decay of the tagged magnetization;
    applying an imaging pulse sequence after each repetitively applied compensation pulse; and
    obtaining images of at least a portion of a specimen based on image signals associated with the imaging pulse sequences, wherein the image signals include contributions from a tagged axial magnetization component and an untagged specimen magnetization associated with the decay of the tagged magnetization.

2. The method of claim 1, wherein the compensation pulse is substantially a $\pi$-pulse.

3. The method of claim 1, wherein the image signal is based on a spatially varying amplitude of the tagged axial magnetization component.

4. The method of claim 1, wherein the image signal is based on a spatially varying phase of the tagged axial magnetization component.

5. A method for magnetic resonance imaging, comprising:
    establishing an initial spatially tagged magnetization throughout a specimen volume;
    repetitively obtaining image signals associated with the initial spatially tagged magnetization in the volume, wherein image signal acquisitions are interleaved with applications of a compensation pulse that is selected to invert at least a portion of the spatially tagged magnetization and an untagged magnetization produced by decay of the spatially tagged magnetization.

6. The method of claim 5, further comprising:
    establishing a subsequent spatially tagged magnetization simultaneously throughout a specimen volume;
    repetitively obtaining image signals associated with the subsequent spatially tagged magnetization in the volume, wherein image signal acquisitions are interleaved with applications of a compensation pulse that is selected to invert at least a portion of the spatially tagged magnetization and at least a portion of an untagged magnetization produced by decay of the spatially tagged magnetization.

7. The method of claim 6, wherein the subsequent spatially tagged magnetization is re-established after a time interval associated with a decrease in magnitude of the initial spatially tagged magnetization.

8. The method of claim 6, further comprising displaying images based on the image signals.

9. A method, comprising:
    (a) situating a specimen in a substantially constant magnetic field that is directed along a z-axis so as to establish a substantially constant magnetization in at least a selected portion of the specimen, the constant magnetization having a magnitude $M_0$;
    (b) selecting a flip angle $\alpha$;
    (c) establishing a stored longitudinal magnetization having an unencoded component with an initial magnitude $M_U$ and an encoded component with an initial magnitude $M_{ENC}$ in a specimen, wherein the magnitudes $M_U$ and $M_{ENC}$ are based on the selected flip angle $\alpha$ and are proportional to the magnitude $M_0$ of the constant magnetization;
    (d) allowing the stored longitudinal magnetization to evolve for a time $\tau_1$ such that the magnitude of the encoded component of magnetization is proportional to $M_{ENC} \exp[-\tau_1/T_1]$ and the magnitude of the unencoded component of magnetization is based on a sum of $M_0(1-\exp[-\tau_1/T_1])$ and $M_U \exp[-\tau_1/T_1]$;
    (e) obtaining at least part of a specimen image based on the evolved stored longitudinal magnetization;
    (f) inverting the evolved stored longitudinal magnetization and allowing the inverted magnetization to evolve for a time $\tau_2$ such that the magnitude of the encoded component of magnetization is substantially proportional to $-M_{ENC} \exp[-(\tau_1+\tau_2)/T_1]$ and the unencoded component is substantially proportional to $-M_U \exp[-(\tau_1+\tau_2)/T_1]$; and
    (g) obtaining at least part of an image based on the inverted evolved magnetization.

10. The method of claim 9, wherein the flip angle $\alpha$ is selected so that the initial magnitudes $M_U$ and $M_{ENC}$ are substantially the same.

11. The method of claim 9, wherein the flip angle is selected a so that the initial magnitude $M_U$ is substantially zero.

12. The method of claim 9, wherein $\tau_1$ and $\tau_2$ are substantially equal.

13. The method of claim 12, further comprising repeating steps (d)-(g) to obtain a plurality of specimen images.

* * * * *